United States Patent
Dorf et al.

(10) Patent No.: US 9,799,491 B2
(45) Date of Patent: Oct. 24, 2017

(54) LOW ELECTRON TEMPERATURE ETCH CHAMBER WITH INDEPENDENT CONTROL OVER PLASMA DENSITY, RADICAL COMPOSITION AND ION ENERGY FOR ATOMIC PRECISION ETCHING

(71) Applicant: APPLIED MATERIALS, INC., Santa Clara, CA (US)

(72) Inventors: Leonid Dorf, San Jose, CA (US); Kenneth S. Collins, San Jose, CA (US); Shahid Rauf, Pleasanton, CA (US); Kartik Ramaswamy, San Jose, CA (US); James D. Carducci, Sunnyvale, CA (US); Hamid Tavassoli, Cupertino, CA (US); Olga Regelman, Daly City, CA (US); Ying Zhang, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/146,133

(22) Filed: May 4, 2016

(65) Prior Publication Data
US 2017/0125217 A1 May 4, 2017

Related U.S. Application Data

(60) Provisional application No. 62/247,949, filed on Oct. 29, 2015.

(51) Int. Cl.
*H01J 37/32* (2006.01)
*H01J 37/06* (2006.01)
*H01L 21/3065* (2006.01)

(52) U.S. Cl.
CPC ........ *H01J 37/32174* (2013.01); *H01J 37/06* (2013.01); *H01J 37/3244* (2013.01);
(Continued)

(58) Field of Classification Search
CPC .......... H01J 37/32174; H01J 37/32458; H01J 37/32082; H01J 37/3244; H01J 37/32532;
(Continued)

(56) References Cited

U.S. PATENT DOCUMENTS 6,116,187 A * 9/2000 Murakami .......... H01J 37/3233
  118/723 AN
8,951,384 B2 * 2/2015 Dorf ....................... H05H 1/46
  156/345.4

(Continued)

FOREIGN PATENT DOCUMENTS

KR 10-2014-0078747 A 6/2014

OTHER PUBLICATIONS

U.S. Appl. No. 14/940,539 Unpublished (filed Nov. 13, 2015) (Leonid Dorf, et al., inventor).

*Primary Examiner* — Anita Alanko
(74) *Attorney, Agent, or Firm* — Fish & Richardson P.C.

(57) ABSTRACT

The disclosure concerns a method of operating a plasma reactor having an electron beam plasma source for independently adjusting electron beam energy, plasma ion energy and radical population. The disclosure further concerns an electron beam source for a plasma reactor having an RF-driven electrode for producing the electron beam.

7 Claims, 4 Drawing Sheets

(52) U.S. Cl.
CPC .. *H01J 37/32082* (2013.01); *H01J 37/32422* (2013.01); *H01J 37/32458* (2013.01); *H01J 37/32532* (2013.01); *H01J 37/32357* (2013.01); *H01J 2237/3151* (2013.01); *H01J 2237/3174* (2013.01); *H01J 2237/334* (2013.01); *H01J 2237/3348* (2013.01); *H01L 21/3065* (2013.01)

(58) Field of Classification Search
CPC ............... H01J 37/06; H01J 37/32422; H01J 2237/3151; H01J 37/32357; H01J 2237/3174; H01J 2237/334; H01J 2237/3348; H01L 21/3065
See application file for complete search history.

(56) References Cited

U.S. PATENT DOCUMENTS

| | | | |
|---|---|---|---|
| 9,129,777 B2* | 9/2015 | Dorf | H01J 37/32082 |
| 9,250,294 B2* | 2/2016 | Wagner | B60Q 1/1469 |
| 9,443,700 B2* | 9/2016 | Dorf | H01J 37/3233 |
| 2009/0314633 A1 | 12/2009 | Walton et al. | |
| 2013/0098872 A1* | 4/2013 | Dorf | H01J 37/3233 |
| | | | 216/67 |
| 2014/0116621 A1 | 5/2014 | Mori et al. | |
| 2014/0199848 A1 | 7/2014 | Rogers | |
| 2014/0339980 A1* | 11/2014 | Wu | H01J 37/32669 |
| | | | 315/5.13 |
| 2014/0370708 A1* | 12/2014 | Wu | H01L 21/0273 |
| | | | 438/694 |
| 2015/0093862 A1 | 4/2015 | Nainani et al. | |
| 2016/0064231 A1* | 3/2016 | Agarwal | B81C 1/00531 |
| | | | 438/712 |

* cited by examiner

LOW ELECTRON TEMPERATURE ETCH CHAMBER WITH INDEPENDENT CONTROL OVER PLASMA DENSITY, RADICAL COMPOSITION AND ION ENERGY FOR ATOMIC PRECISION ETCHING

CROSS-REFERENCE TO RELATED APPLICATIONS

This application claims benefit of U.S. Provisional Application No. 62/247,949, filed Oct. 29, 2015 entitled LOW ELECTRON TEMPERATURE ETCH CHAMBER WITH INDEPENDENT CONTROL OVER PLASMA DENSITY, RADICAL COMPOSITION AND ION ENERGY FOR ATOMIC PRECISION ETCHING, by Leonid Dorf, et al.

BACKGROUND

Technical Field

The disclosure concerns a low electron temperature etch chamber with independent control over plasma density, radical composition and ion energy for atomic precision etching.

Background Discussion

Diminishing scale and increasing complexity of microfabrication processes necessitate the use of novel ultra-sensitive materials, which in turn requires low-damage plasma etching with atomic layer precision. This imposes progressively stringent demands for accurate control over ion energy and radical composition during plasma processing.

SUMMARY

A method of processing a workpiece in a processing chamber, comprises: limiting plasma electron temperature by generating a plasma in the processing chamber with a sheet electron beam parallel to a surface of the workpiece; controlling workpiece potential with respect to plasma in a range between 0 and 25 volts by applying bias power to a workpiece support in the chamber; and independently controlling radical population in the plasma by controlling production rate of a remote plasma source feeding the processing chamber.

In one embodiment, the limiting of the plasma electron temperature is performed so as to limit workpiece potential with respect to the plasma to not more than a few volts in absence of an applied bias power.

In one embodiment, the electron beam energy is limited to a range (such as from sub-keV to a few keV) so as to limit dissociation or radical production by the electron beam.

In one embodiment, the bias power controls the plasma ion energy to be on an order of or near a bonding energy of a material in the workpiece being etched.

A related method of processing a workpiece in a processing chamber comprises: generating a plasma in the processing chamber while limiting plasma electron temperature by propagating an electron beam in the processing chamber; controlling a level of bias power coupled to a workpiece support so as to set plasma ion energy to be on an order of or near a bonding energy of a material on the workpiece being etched; and controlling radical population in the plasma by controlling production rate of a remote plasma source coupled to the processing chamber. In one optional embodiment, the electron beam energy is limited to a range (such as from sub-keV to a few keV) so as to limit dissociation or radical production by the electron beam.

A plasma reactor for processing a workpiece comprises: an electron beam gun enclosure having a beam outlet opening at one end of the enclosure and enclosing an electron emission electrode at an opposite end of the enclosure, the electron emission electrode having an electron emission surface facing the beam outlet, the beam outlet and the electron emission electrode defining a beam propagation path between them; an RF power source and an RF power conductor coupled between the RF power source and the electron emission electrode; and a processing chamber having a beam entry port aligned with the beam outlet, a workpiece support in the processing chamber for supporting a workpiece in a plane parallel with the beam propagation path, and a gas distributor coupled to the processing chamber.

In one embodiment, the RF power source comprises a first RF power generator and an impedance match coupled between the first RF power generator and the electron emission electrode. In a further embodiment, the impedance match comprises a dual frequency impedance match, the power source further comprising a second RF power generator having a frequency different from a frequency of the first RF power generator. In one embodiment, the first RF power generator produces a low frequency and second RF power generator produces a high frequency.

In one embodiment, the plasma reactor further comprises a gas supply having a feed path to the electron beam gun enclosure. In one embodiment, the plasma reactor further comprises an ion-blocking filter in the beam outlet opening, the ion-blocking filter permitting flow of electrons through the beam outlet.

In one embodiment, the plasma reactor further comprises: a backing plate insulated from the electron gun enclosure and contacting a back face of the electron emitting electrode; a chiller plate contacting the backing plate; and the RF power conductor is connected to the chiller plate. In one embodiment, the plasma reactor further comprises an insulator surrounding an edge of the electron emitting electrode and disposed between the electron emitting electrode and the electron gun enclosure.

In one embodiment, the plasma reactor further comprises a process gas supply coupled to the gas distributor.

In one embodiment, the plasma reactor further comprises a remote plasma source coupled to the processing chamber.

In one embodiment, the plasma reactor further comprises a bias power generator coupled to the workpiece support.

In one embodiment, the first RF power generator, the second RF power generator, the bias power generator and the remote plasma source are independently controllable.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The drawings in the figures are all schematic and not to scale.

DETAILED DESCRIPTION

Introduction:

Using an electron sheet beam (e-beam) parallel to the workpiece surface to produce plasma in a processing chamber provides an order of magnitude reduction in plasma electron temperature Te (~0.3 eV) and plasma ion energy (Ei less than a few eV in the absence of applied bias power) compared to conventional plasma technologies, thus making an electron beam-generated plasma an ideal candidate for processing features at 5 nm and below. Furthermore, since dissociation is performed only by high-energy beam electrons and not plasma electrons, and since the dissociation cross-section drops off considerably at or below electron beam energies of about 2 keV, the chemical composition of an electron beam-created plasma can be made radical-poor by limiting the electron beam energy in accordance with one option. This allows for independent control over plasma radical composition by an external radical source, which is another advantage of using electron beam technology to create plasma.

Figure 1:
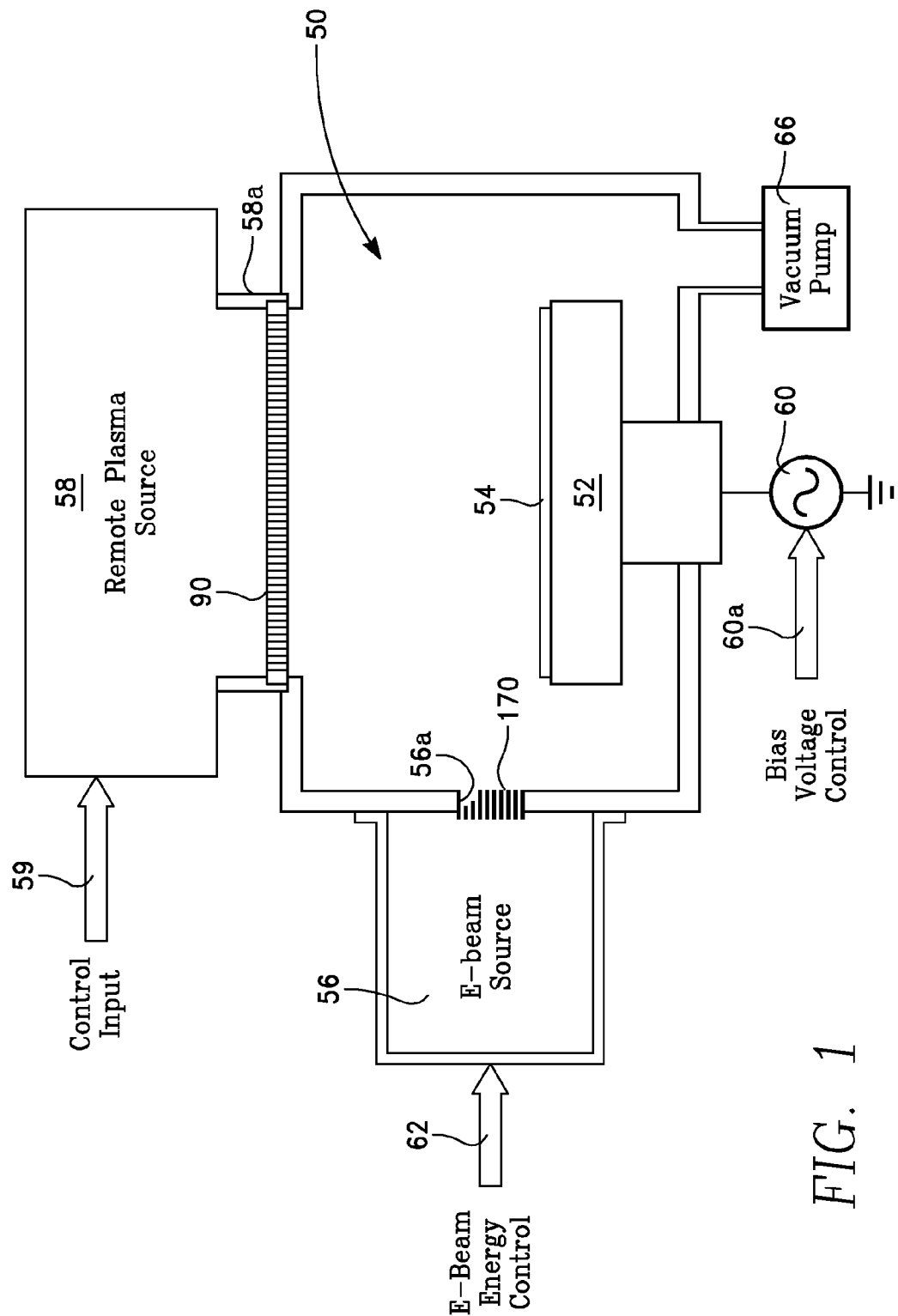
FIG. 1 illustrates a low damage reactor in accordance with a first embodiment.

Low Damage Reactor:

In a first embodiment depicted in FIG. 1, a low-damage reactor is provided that enables atomic precision processing (as in atomic layer etching) and independent control of plasma ion energy and radical composition of the plasma. The low-damage reactor includes: a processing chamber 50 including an electrostatic chuck 52 holding a workpiece 54, an electron beam (e-beam) source 56 for creating a radical-poor, low-electron temperature (Te) plasma in the processing chamber 50, a remote plasma source 58 for producing and supplying radicals through an outlet 58a to plasma in the processing chamber 50, and a bias power generator 60 for creating a voltage drop (with fine control in 0-50 V range) between the workpiece 54 and the plasma to accelerate ions over etch-threshold energies. The outlet 58a may include an ion-blocking grid 90. A beam outlet 56a of the e-beam source 56 is covered by a filtering grid 170 that admits electrons forming the electron beam but blocks ions and other plasma by-products produced within the e-beam source 56.

The bias power generator 60 may have a bias voltage control input 60a that provides the fine control in a 0-50 V range. In one embodiment, the range is 0-25V. The electron beam source 56 includes a beam acceleration voltage control input 62 that controls the electron energy of the electron beam source 56. The remote plasma source 58 has a control input 59 for controlling the rate at which the remote plasma source 58 supplies radicals into the processing chamber 50. The control input 59 is independent of the beam acceleration voltage control input 62. The rate at which the remote plasma source 58 supplies radicals into the processing chamber 50 and the energy of the electron beam are controlled independently of one another. The control input 59 may be implemented in various ways. For example, the control input 59 may control the power level of an RF generator driving a plasma source power applicator (not shown) in the remote plasma source 58. As another possibility, the control input 59 may control a valve at the outlet 58a between the remote plasma source 58 and the processing chamber 50. A vacuum pump 66 may be provided for evacuating the processing chamber 50.

Because of the ultra-low electron temperature in the electron-beam generated plasma, the workpiece potential with respect to the plasma is very low, just a few volts, without an applied bias. This is much lower than in conventional plasma etch tools, where it is typically confined to a range above or exceeding about 15 V. Thus, unlike conventional tools, the low-damage reactor of FIG. 1 enables precise control of ion energy in the range of 0-25 V by limiting the applied bias power accordingly. In this very important range, the plasma ion energy is near (e.g., within 10% of) or on the order of the bond energy of the etched material, which enables performance of an ultra-low damage etch process. The etch rate is likewise quite low at such ion energies —just a few Angstroms per minute—which makes the low damage reactor also uniquely suitable for atomic precision etching or atomic layer etching. Another critical advantage enabling precise control over the etch process is achieved through independent control over the radical composition governed by the radical production rate of the remote plasma source 58. As a result, true atomic precision etching with ultra-low damage and only one to a few atomic layers per minute etch rates is carried out in the low damage reactor.

In one embodiment, a method of operating the low-damage reactor chamber is provided, in which the plasma ion energy and the radical composition of the plasma are independently controlled. The method is depicted in FIG. 2 and proceeds as follows:

First, limit plasma electron temperature to not exceed 0.3 eV and plasma ion energy to not exceed a few eV in absence of applied bias power. This is done by generating in the e-beam source 56 a sheet electron beam parallel to the workpiece surface (block 310 of FIG. 2). This beam creates plasma in the processing chamber 50. Such limiting of the plasma electron temperature helps to minimize workpiece potential relative to the plasma (i.e., sheath voltage) to not more than about a few volts without applied bias.

Figure 2:
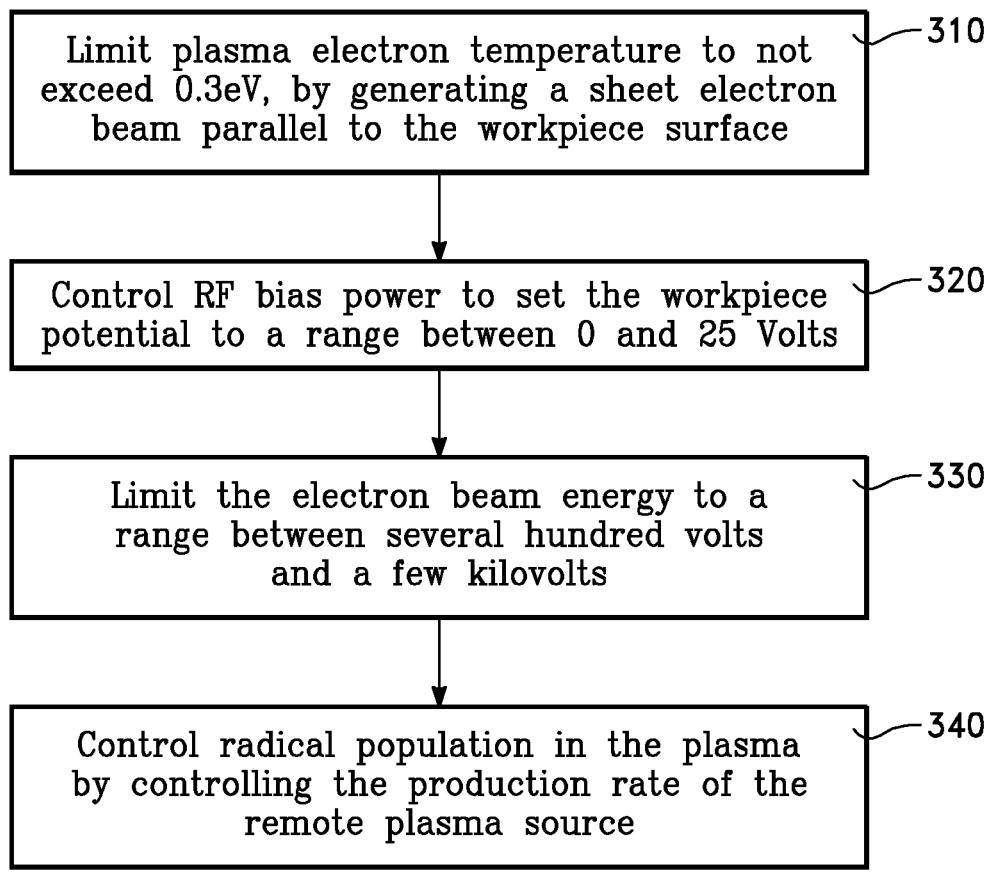
FIG. 2 depicts a method of operating the reactor of FIG. 1.

Second, control workpiece potential with reference to the plasma inside the processing chamber 50 by controlling the bias power generator 60 to set the workpiece potential to a range between 0 and 25 volts (block 320 of FIG. 2). Alternatively or equivalently, set the plasma ion energy to near the bonding energy of the material being etched by controlling the bias power generator 60.

Third, as one option that is not necessarily required, limit electron beam energy to a range between several hundred volts and a few kilovolts (block 330 of FIG. 2). This has the effect of minimizing dissociation or radical production by the electron beam.

Fourth, independently control radical population in the plasma by controlling production rate of the remote plasma source feeding the processing chamber (block 340 of FIG. 2).

E-Beam Source with RF-Driven Electrode:

The challenges of developing an industry-worthy electron beam plasma source include meeting the following requirements:

1. Process-chemistry compatibility: chemically aggressive and/or depositing process gas should not affect e-beam source (gun) operation or render it impossible, as with DC electron beam sources; conversely, sputtering of the e-beam gun parts should not adversely affect the process.
2. Capability for operation over a wide range of process gas chamber pressures.
3. Robustness, i.e. ability to operate for a long time between the preventive maintenance events involving parts replacement.
4. High operational stability and reproducibility.
5. Independent control over density and energy of beam electrons.

What is needed is an electron beam source that satisfies the foregoing criteria.

Figure 3:
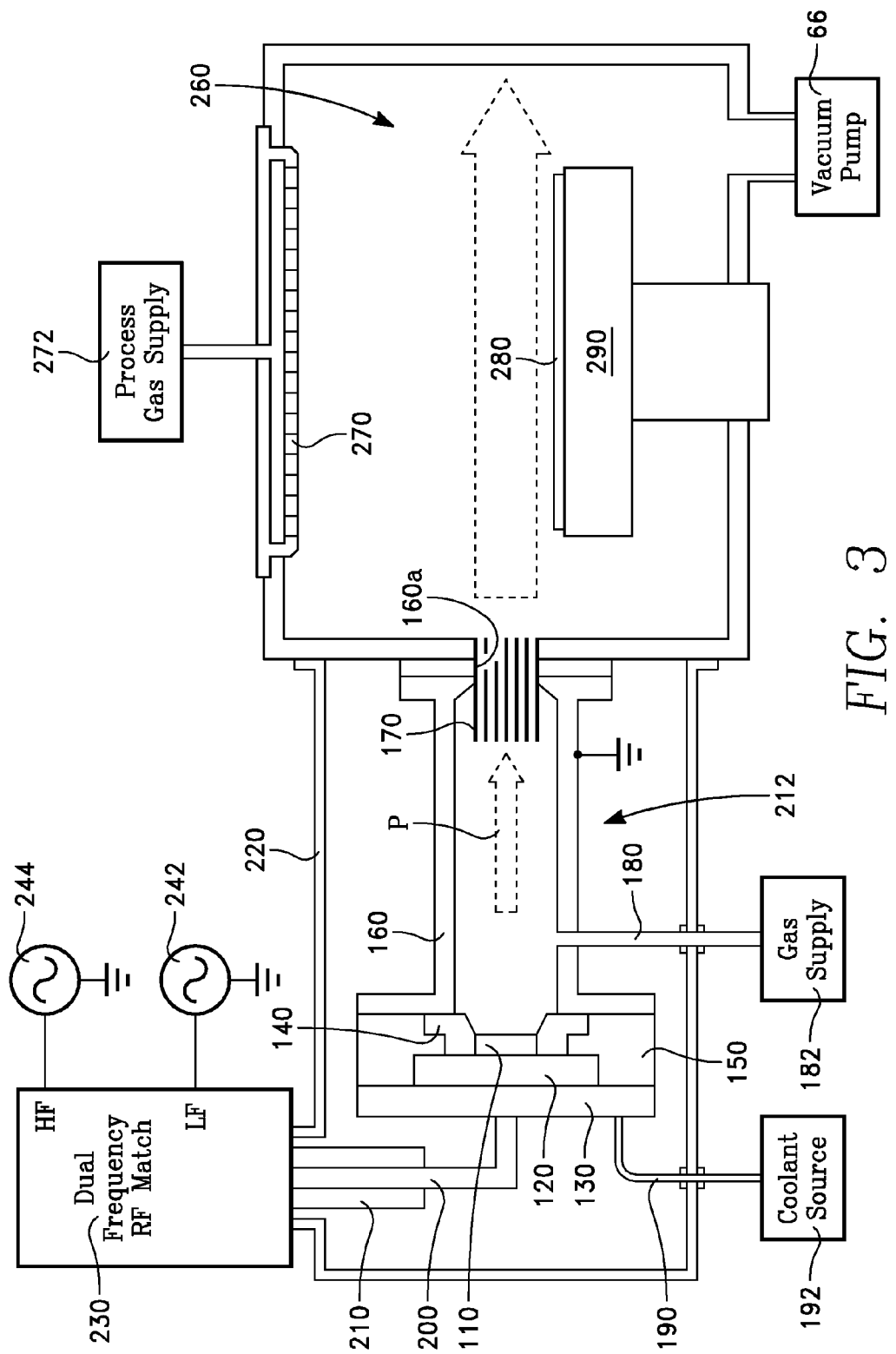
FIG. 3 illustrates a plasma reactor having an electron beam source including an RF-driven electron emission electrode.

FIG. 3 depicts an embodiment of a plasma reactor having an electron beam (e-beam) plasma source that satisfies the criteria discussed above. Referring to FIG. 3, an emitting electrode 110 is mounted on a backing plate 120. The backing plate 120 is mounted on a chill plate 130. A ceramic spacer 140 and an insulator 150 hold the emitting electrode 110 in place relative to an electron gun body 160. The electron gun body 160 may be formed of an electrically conductive material and be connected to a return potential or to ground. In the illustrated embodiment, the electron gun body 160 extends along an e-beam propagation path P and has a beam outlet opening 160a at a distal end opposite the emitting electrode 110. A filtering grid 170 is positioned within the beam outlet opening 160a. A backfill gas feed 180 conducts gas suitable as an electron source (e.g., Argon) from a gas supply 182 into the interior of the electron gun body 160. A coolant liquid feed or conduit 190 conducts coolant from a coolant source 192 to the chill plate 130. An RF feed 200 conducts RF power to the emitting electrode 110 through the chill plate 130 and through the backing plate 120. An insulator 210 surrounds a portion of the RF feed 200. The electron gun body 160, the emitting electrode 110, the backing plate 120, the chill plate 130, the ceramic spacer 140, the insulator 150 and the RF feed 200 together form an e-beam source assembly 212, which is contained within an RF shield 220. The RF feed 200 receives RF power through a dual frequency impedance match 230 from RF power generators 242 and 244. In one embodiment, the RF power generator 242 produces low frequency RF power and the RF power generator 244 produces high frequency RF power.

Figure 4:
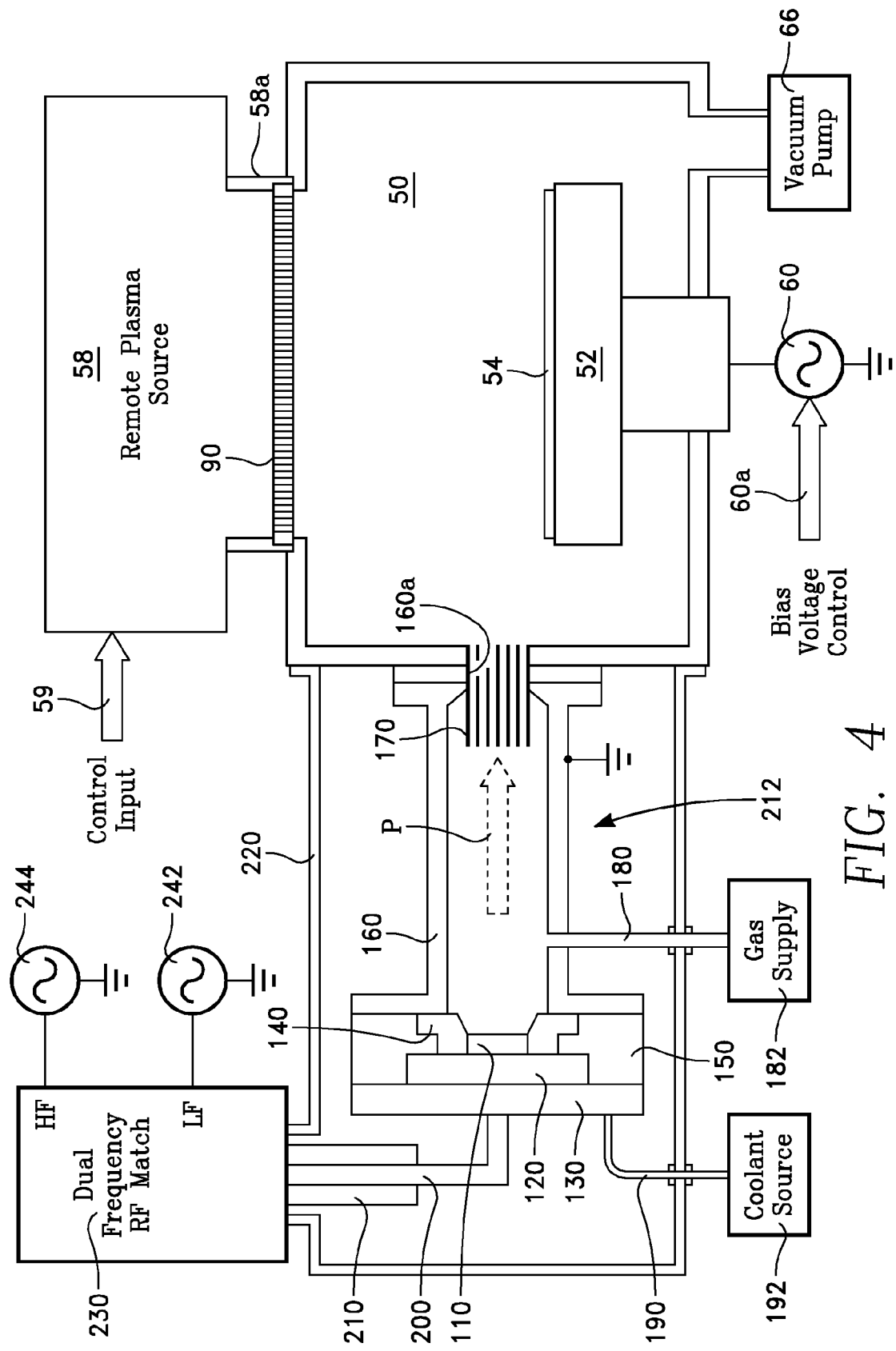
FIG. 4 depicts a modification of the embodiment of FIG. 1 in which the e-beam source is the electron beam source of FIG. 3 that includes an RF-driven electron emission electrode.

In one modification, the e-beam source assembly 212 of the embodiment of FIG. 3 may be used as the e-beam source assembly 212 of the embodiment of FIG. 1. Such a modification is depicted in FIG. 4.

A process chamber 260 is coupled to the electron gun body 160 through the opening 160a, and has a ceiling gas distributor 270 coupled to a process gas supply 272. An electrostatic chuck 280 within the process chamber 260 supports a workpiece 290 in a plane parallel to the beam propagation path P.

An RF plasma discharge is ignited between the emitting electrode 110 and the electron gun body 160 that serves as an RF return. Two RF frequencies can be supplied by the RF power generators 242, 244 including a low frequency such as 2 MHz, and a HF or VHF frequency such as 60 MHz. This provides independent control over: (1) the density of plasma (controlled by the level of the HF or VHF power), which determines the density of the beam electrons, and (2) the DC self-bias at the emitting electrode 110 (controlled by the level of the low frequency power), which determines the energy of the beam electrons. Generally, the energy of the beam electrons may be controlled by controlling the output power level of the low frequency bias power generator 242. Independent control over beam electron density can also be achieved by adding an inductively coupled plasma source to the e-beam source assembly 212.

Because the area of the electron gun body 160 is larger than the area of the emitting electrode 110, the RF-induced DC self-bias will be much larger at the smaller emitting electrode 110, and can reach a level appropriate for the electron beam technology. For example, the self-bias can reach 1-1.5 kV at about 1.5 kW of 2 MHz power with about 600 W of 60 MHz power, at an internal pressure within the electron gun body 160 of about 20 mT. The ions accelerated in the sheath at the emitting electrode 110 bombard the electrode surface and cause ion-induced secondary electron emission. These emitted secondary electrons are in turn accelerated in the same sheath voltage drop as they move away from the electrode surface, resulting in formation of the electron beam. Thus, the secondary electron emission coefficient of the emitting surface of the emitting electrode 110 plays a very significant role in determining the density of the beam electrons.

A significant portion of the applied RF power is deposited into the emitting electrode 110 in the form of heat, due to constant bombardment by high-energy ions. The chiller plate 130 has non-conductive cooling fluid running through it, and is coupled through the backing plate 120 to the emitting electrode 110. The RF feed 200 is coupled through the chill plate 130 and the backing plate 120 to the emitting electrode 110. The backing plate 120 serves as an RF plate distributing applied RF power evenly over the emitting electrode 110.

The filtering grid 170 has high aspect ratio openings and prevents leakage of the RF plasma ions and radicals created inside the electron gun body 160 into the process chamber 260. Further, the chemically aggressive process gas inside the process chamber 260 is blocked from entering the interior of the electron gun body 160. This gas separation is achieved using the back fill gas feed 180 by backfilling the interior of the electron gun body 160 with inert gas such as Argon, supplied at a sufficiently high flow rate to create a considerable gas pressure drop (for example, about 30 mT) across the filtering grid 170. In turn, high-energy electrons can go through the high aspect ratio openings of the filtering grid 170, due to high directionality of their velocity distribution.

Backfilling the interior of the electron gun body 160 with process-independent gas also allows modification of the electrode emitting surface of the emitting electrode 110 to control secondary electron emission coefficient by forming, for example, a Silicon Nitride on the surface. Due to the nature of the plasma discharge, practically any material (silicon, ceramic, quartz) can be used to form the emitting surface of the emitting electrode 110 without affecting general operation of e-beam source assembly 212.

The material sputtered by the ions off of the emitting electrode 110 and re-deposited on the other parts of the e-beam source assembly 212 can be cleaned in-situ by running HF or ICP plasma only (at much lower self-bias) with appropriate chemistry, if the emitting surface material is adequately selected. Likewise, the grounded surface of the electron gun body 160 can be coated with any process-compatible and not necessarily conductive material, as long as the capacitance of the coating layer is sufficiently small. Penetration of the sputtered material into the process chamber 260 is also considerably restricted by the filtering grid 170.

Advantages:

An advantage of using an RF-driven electrode (i.e., the electrode 110) rather than a DC discharge to create the electron beam is that electron beam density and electron beam energy are independently controlled by high frequency power and low frequency power, respectively, applied to the electrode 110. Further, use of metals or other conductive materials may be minimized in the construction of the e-beam source assembly 212, which makes penetration of any sputtered material through the filtering grid 170 into the process chamber 260 generally less damaging for the wafer processing.

Using an electron sheet beam (e-beam) parallel to the workpiece surface to produce plasma in a processing chamber provides an order of magnitude reduction in plasma electron temperature Te (~0.3 eV) and plasma ion energy Ei (<2 eV in the absence of applied bias power) compared to conventional plasma technologies. This enables the plasma ion energy to be reduced to near or below the binding energy of the material being etched (e.g., silicon, silicon oxide, silicon nitride). Furthermore, since dissociation is performed only by high-energy beam electrons and not plasma electrons, and since the dissociation cross-section drops off considerably at or below electron beam energies of about 2 keV, the chemical composition of an electron beam-created plasma can be made radical-poor. This allows for independent control over plasma radical composition by the remote radical source 58.

While the foregoing is directed to embodiments of the invention, other and further embodiments of the invention may be devised without departing from the basic scope thereof, and the scope thereof is determined by the claims that follow.

What is claimed is:

1. A method of processing a workpiece in a processing chamber, comprising:
    limiting plasma electron temperature to not exceed 0.3 eV by generating a plasma in said processing chamber with a sheet electron beam parallel to a surface of the workpiece;
    controlling workpiece potential with respect to the plasma to a range between 0 and 25 volts by controlling a level of bias power coupled to a workpiece support; and
    independently controlling radical population in the plasma by controlling production rate of a remote plasma source feeding the processing chamber.

2. The method of claim 1 wherein said limiting of the plasma electron temperature is performed to limit workpiece potential with respect to the plasma to not more than about 15 volts in absence of an applied bias power.

3. The method of claim 1 further comprising limiting electron beam energy to a range from sub-keV to about 2 keV.

4. The method of claim 1 wherein controlling the level of bias power comprises setting a plasma ion energy to be within 10 percent of a bonding energy of a material in said workpiece being etched.

5. A method of processing a workpiece in a processing chamber, comprising:
    generating a plasma in said processing chamber while limiting plasma electron temperature to not exceed 0.3 eV by propagating an electron beam in said processing chamber;
    controlling a level of bias power coupled to a workpiece support so as to set plasma ion energy to be within 10 percent of a bonding energy of a material on said workpiece being etched; and
    controlling radical population in the plasma by controlling production rate of a remote plasma source coupled to the processing chamber.

6. The method of claim 5 wherein said plasma ion energy corresponds to a workpiece potential with respect to the plasma of not more than about 15 volts in absence of an applied bias power.

7. The method of claim 5 further comprising limiting electron beam energy of said electron beam to a range from sub-keV to about 2 keV.

* * * * *